(12) United States Patent
Takakura et al.

(10) Patent No.: US 11,827,762 B2
(45) Date of Patent: Nov. 28, 2023

(54) METALLIC DECORATIVE MEMBER, AND METALLIC DECORATIVE MOLDED BODY USING SAME

(71) Applicant: Dai Nippon Printing Co., Ltd., Tokyo (JP)

(72) Inventors: Tsubasa Takakura, Kitamoto (JP); Naoki Sasou, Tsukubamirai (JP); Atsushi Tokumitsu, Kashiwa (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 358 days.

(21) Appl. No.: 17/058,155

(22) PCT Filed: May 31, 2019

(86) PCT No.: PCT/JP2019/021749
§ 371 (c)(1),
(2) Date: Nov. 24, 2020

(87) PCT Pub. No.: WO2019/230955
PCT Pub. Date: Dec. 5, 2019

(65) Prior Publication Data
US 2021/0198441 A1 Jul. 1, 2021

(30) Foreign Application Priority Data
Jun. 1, 2018 (JP) .................. 2018-106472

(51) Int. Cl.
*C08J 7/052* (2020.01)
*C08J 7/043* (2020.01)
(Continued)

(52) U.S. Cl.
CPC ............ *C08J 7/052* (2020.01); *B32B 15/082* (2013.01); *B32B 27/302* (2013.01); *C08J 7/043* (2020.01);
(Continued)

(58) Field of Classification Search
None
See application file for complete search history.

(56) References Cited

U.S. PATENT DOCUMENTS 4,101,698 A 7/1978 Dunning et al.
4,407,871 A * 10/1983 Eisfeller ............. C23C 14/5806
427/296
(Continued)

FOREIGN PATENT DOCUMENTS

CN 1881052 A 12/2006
CN 207274043 U 4/2018
(Continued)

OTHER PUBLICATIONS

Tsukuda—JP 2003-253016 A—MT—decorative acrylic film w-acrylic rubber particles—indium—2003 (Year: 2003).*
(Continued)

*Primary Examiner* — John Vincent Lawler
(74) *Attorney, Agent, or Firm* — Locke Lord LLP

(57) ABSTRACT

The present invention relates to a metallic decorative member which when a transparent base material containing rubber particle is used, is able to make the metallic luster after molding excellent. The metallic decorative member is one including a metal vapor deposited film having a metal vapor deposited layer on a transparent base material, the transparent base material being disposed so as to face toward the outer layer side, wherein the transparent base material is a transparent resin base material containing rubber particles and a binder resin; the metal vapor deposited layer has island portions composed of a metal and sea portions positioning between the island portions; and an area A per island portion is 4,400 to 56,000 $nm^2$.

8 Claims, 3 Drawing Sheets

(51) Int. Cl.
  *C08J 7/046* (2020.01)
  *B32B 15/082* (2006.01)
  *B32B 27/30* (2006.01)
  *C08J 7/06* (2006.01)
  *C08L 55/02* (2006.01)
  *C23C 14/20* (2006.01)
  *C23C 14/24* (2006.01)
  *C08L 21/00* (2006.01)

(52) U.S. Cl.
  CPC ............... *C08J 7/046* (2020.01); *C08J 7/06* (2013.01); *C08L 55/02* (2013.01); *C23C 14/20* (2013.01); *C23C 14/24* (2013.01); *C08J 2333/10* (2013.01); *C08J 2475/04* (2013.01); *C08L 21/00* (2013.01); *C08L 2207/53* (2013.01)

(56) References Cited

U.S. PATENT DOCUMENTS

| | | | | |
|---|---|---|---|---|
| 4,431,711 | A * | 2/1984 | Eisfeller | B05D 5/068 |
| | | | | 427/296 |
| 6,103,390 | A * | 8/2000 | Kamiya | G09F 7/16 |
| | | | | 428/458 |
| 6,287,672 | B1 * | 9/2001 | Fields | B32B 15/08 |
| | | | | 428/209 |
| 6,565,955 | B2 * | 5/2003 | Fields | B32B 7/12 |
| | | | | 428/209 |
| 2005/0175843 | A1 * | 8/2005 | Johnson | B44C 3/025 |
| | | | | 428/423.1 |
| 2006/0290409 | A1 | 12/2006 | Noguchi et al. | |
| 2007/0098967 | A1 * | 5/2007 | Ido | C23C 14/024 |
| | | | | 428/209 |
| 2009/0176123 | A1 | 7/2009 | McKillip et al. | |
| 2011/0141065 | A1 | 6/2011 | Noguchi et al. | |
| 2012/0064353 | A1 | 3/2012 | Kawaguchi et al. | |
| 2013/0312302 | A1 | 11/2013 | McKillip et al. | |
| 2016/0185084 | A1 * | 6/2016 | Kuno | B32B 27/26 |
| | | | | 428/457 |
| 2017/0137928 | A1 * | 5/2017 | Hara | H01Q 1/3283 |
| 2019/0275759 | A1 * | 9/2019 | Nishio | C23C 14/34 |
| 2021/0198441 | A1 | 7/2021 | Takakura et al. | |

FOREIGN PATENT DOCUMENTS

| | | | | |
|---|---|---|---|---|
| EP | 1788111 | A2 | 5/2007 | |
| FR | 2318028 | A1 | 2/1977 | |
| JP | 2003/253016 | * | 9/2003 | ............ B32B 27/30 |
| JP | 2004-299190 | A | 10/2004 | |
| JP | 2007-118350 | * | 5/2007 | ............ B29C 45/14 |
| JP | 2010-155366 | A | 7/2010 | |
| JP | 2010-214790 | A | 9/2010 | |
| JP | 2011-27434 | A | 2/2011 | |
| JP | 2011-143584 | A | 7/2011 | |
| JP | 5809768 | B1 | 11/2015 | |
| TW | I328503 | * | 8/2010 | ............ B29C 45/16 |
| WO | 2007/121152 | A2 | 10/2007 | |
| WO | 2011-099444 | A1 | 8/2011 | |
| WO | 2018-69462 | A | 5/2018 | |
| WO | 2018/169062 | A1 | 9/2018 | |
| WO | 2019/230955 | A1 | 12/2019 | |

OTHER PUBLICATIONS

Peng—TW I328503 B—Bib+MT Google—laminate w-printing & ABS protective layer—2007 (Year: 2007).*
Sawada—JP 2007-118350 A—MT—molded laminate w-primer for adhesion between metal and polymer—2007 (Year: 2007).*
International Search Report dated Jul. 16, 2019, issued for PCT/JP2019/021749.
Supplementary European Search Report dated Jan. 28, 2022, issued for European Patent Application No. 19812100.6.
Official communication dated Aug. 15, 2023, issued in JP application 2023-028284 and English translation thereof.

* cited by examiner

[Fig. 1]
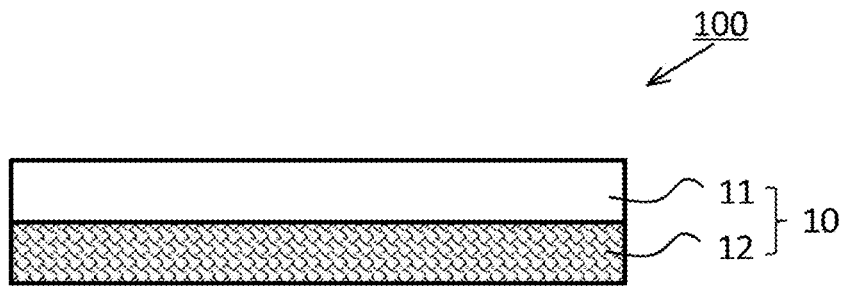
[Fig. 2]
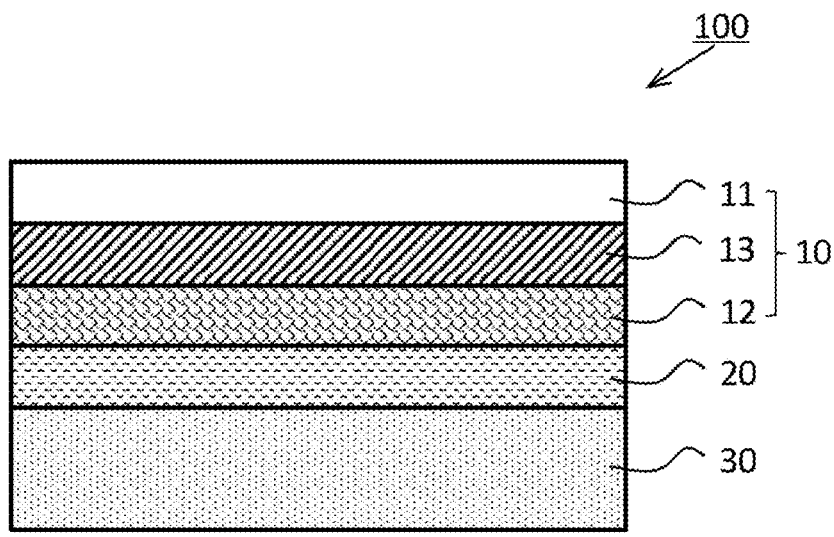
[Fig. 3 (a)]
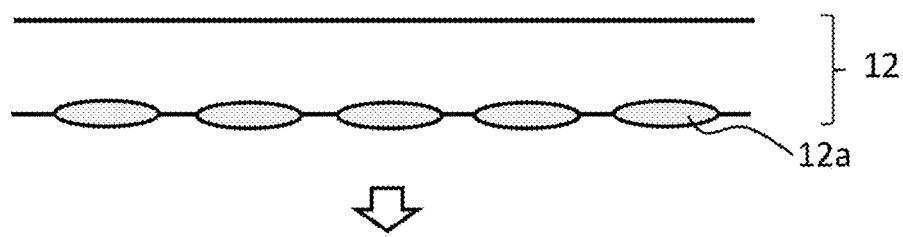
[Fig. 3 (b)]
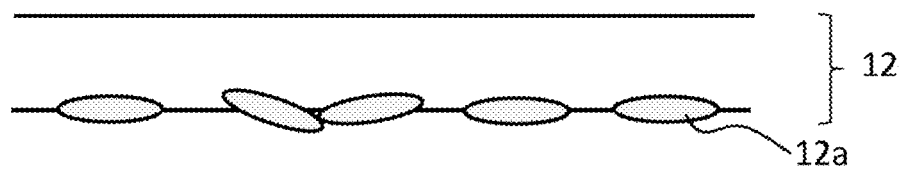

[Fig. 4 (a)]
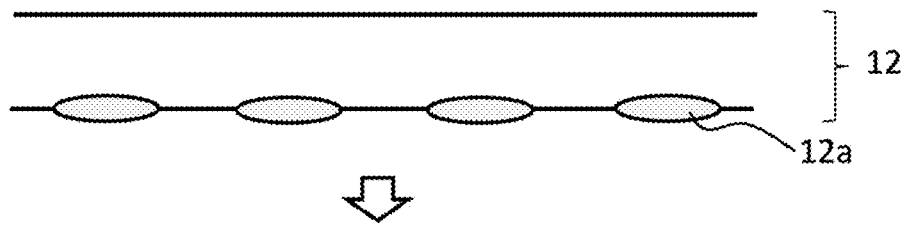
12
12a
[Fig. 4 (b)]
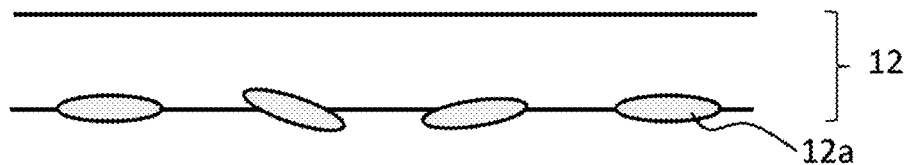
12
12a
[Fig. 5]
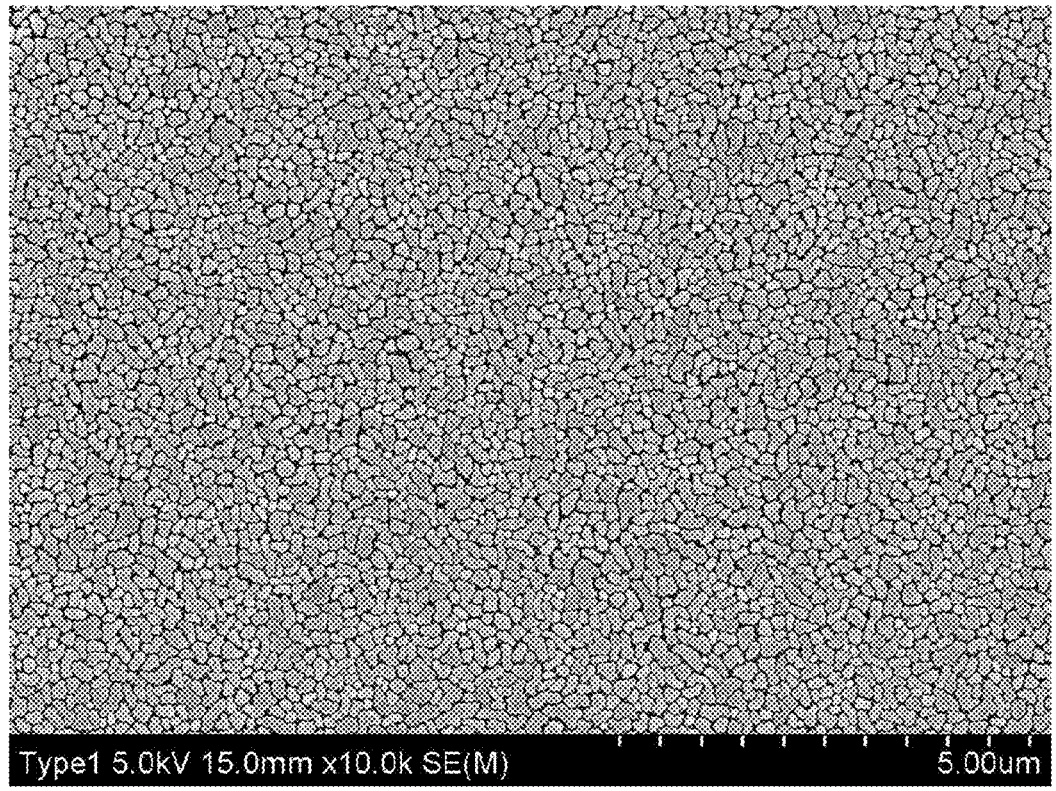

[Fig. 6]
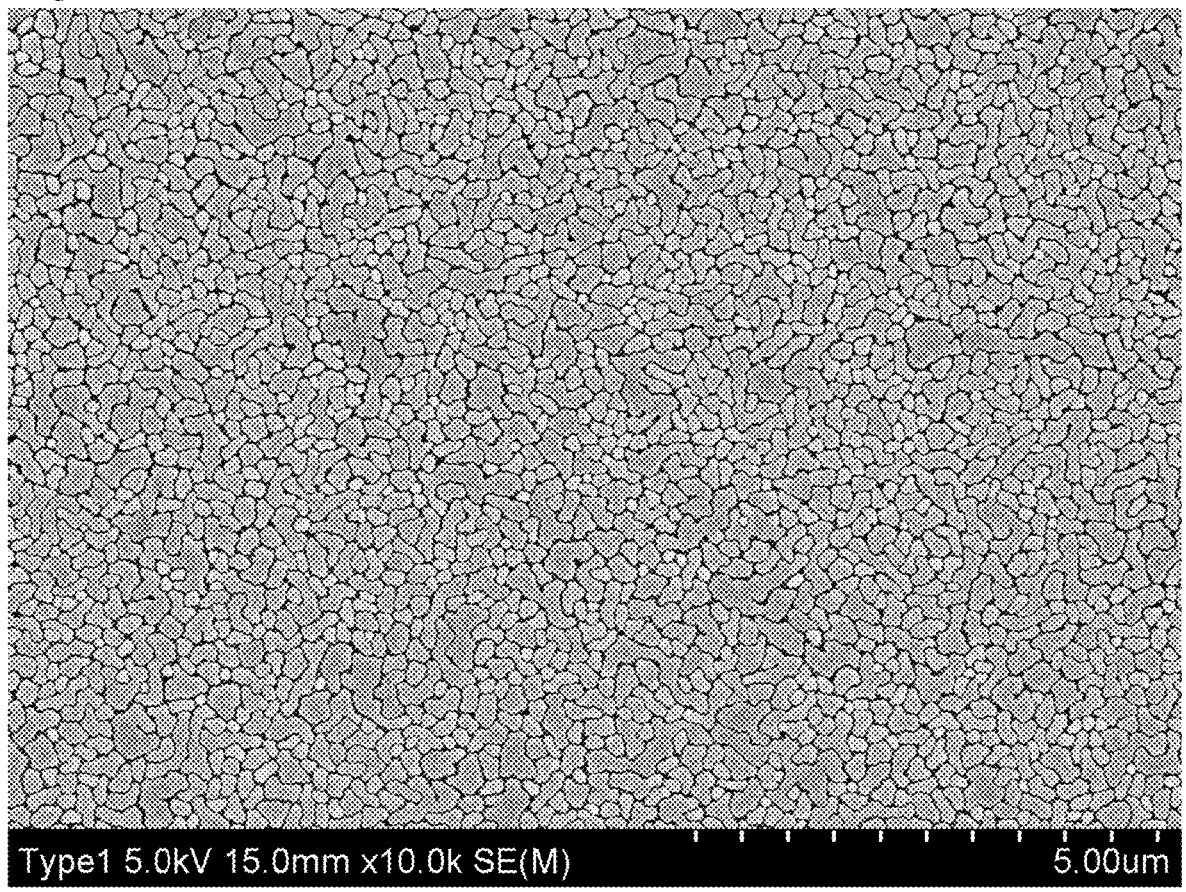

METALLIC DECORATIVE MEMBER, AND METALLIC DECORATIVE MOLDED BODY USING SAME

TECHNICAL FIELD

The present invention relates to a metallic decorative member and a metallic decorative molded body using the same.

BACKGROUND ART

In order to enhance the designability of a molded body, it has hitherto been performed to give a metallic luster on the surface of the molded body. As a measure of giving the metallic luster, metal plating has been adopted from old times. But, the metal plating involved such problems that the process is complicated, resulting in an increase of manufacturing costs and that waste fluids are generated, resulting in applying a load to the environment. In addition, in the case where the surface of a molded body has an uneven shape, it was difficult to apply a uniform and beautiful plating layer.

As an alternative measure for the metal plating, there is proposed a measure in which the surface of an adherend, such as a resin molded body, is decorated by using a decorative sheet having a metal vapor deposited layer formed by physical vapor deposition (PVD) (PTL 1).

CITATION LIST

Patent Literature

PTL 1: Japanese Patent No. 5809768

SUMMARY OF INVENTION

Technical Problem

A basic configuration of the decorative sheet having a metal vapor deposited layer is a metal vapor deposited film provided with a metal vapor deposited layer on a transparent base material. But, since mere use of the metal vapor deposited film involves problems, such as strength poverty, typically, there is often the case where a laminate in which a resin substrate is laminated on the inner layer side of the metal vapor deposited film is fabricated, and the laminate is molded, to obtain a metallic decorative molded body.

However, in the conventional case of obtaining the aforementioned laminate from the metal vapor deposited film and molding the laminate, the fact that an expected metallic luster is not obtained frequently occurred.

Solution to Problem

As a result of extensive and intensive investigations made by the present inventors, they first paid attention to a drying step of the resin substrate. The drying step is a step to be carried out such as before molding of the laminate for the purpose of discharging the moisture of the resin substrate or the like. The present inventors presumed that is not it that during the drying step, the transparent base material of the metal vapor deposited film is shrunken to generate wrinkles on the metal vapor deposited surface, whereby the metallic luster reduced.

However, even by using a transparent base material of the metal vapor deposited film having a low shrinkage ratio, the fact that an expected metallic luster is not obtained after molding frequently occurred.

The present inventors further made extensive and intensive investigations. As a result, they have found that tendency of occurrence of the aforementioned problem in the case of using a specified transparent base material (specifically, a "transparent base material containing rubber particles" to be used for the purpose of making moldability favorable) is high; and further found that even in the case of using such a specified transparent base material, by forming the metal vapor deposited layer so as to have a specified configuration, the metallic luster of the metallic decorative molded body obtained by molding can be made excellent, thereby leading to accomplishment of the present invention.

The present invention provides the following [1] to [2].

[1] A metallic decorative member including a metal vapor deposited film having a metal vapor deposited layer on a transparent base material, the transparent base material being disposed so as to face toward the outer layer side, wherein the transparent base material is a transparent resin base material containing rubber particles and a binder resin; the metal vapor deposited layer has island portions composed of a metal and sea portions positioning between the island portions; and an area A per island portion is 4,400 to 56,000 nm$^2$.

[2] A metallic decorative molded body formed of the metallic decorative member as set forth above in [1].

Advantageous Effects of Invention

In accordance with the present invention, in the case of using the transparent base material containing rubber particles, it is possible to provide a metallic decorative member capable of making the metallic luster after molding excellent, and a metallic decorative molded body using the same.

BRIEF DESCRIPTION OF DRAWINGS

FIG. 1 is a cross-sectional view showing an embodiment of the metallic decorative member of the present invention.

FIG. 2 is a cross-sectional view showing another embodiment of the metallic decorative member of the present invention.

FIG. 3(a) and FIG. 3(b) are schematic views explaining an example of the behavior of island portions of the metal vapor deposited layer at the time of heating.

FIG. 4(a) and FIG. 4(b) are schematic views explaining another example of the behavior of island portions of the metal vapor deposited layer at the time of heating.

FIG. 5 is an SEM photograph of the metal vapor deposited layer of the metallic decorative member of Example 1.

FIG. 6 is an SEM photograph of the metal vapor deposited layer of the metallic decorative member of Comparative Example 1.

DESCRIPTION OF EMBODIMENTS

[Metallic Decorative Member]

The metallic decorative member of the present invention is one including a metal vapor deposited film having a metal vapor deposited layer on a transparent base material, the transparent base material being disposed so as to face toward the outer layer side, wherein the transparent base material is a transparent resin base material containing rubber particles and a binder resin; the metal vapor deposited layer has island portions composed of a metal and sea portions positioning between the island portions; and an area A per island portion is 4,400 to 56,000 nm$^2$.

FIGS. 1 and 2 are each a cross-sectional view showing an embodiment of the metallic decorative member of the present invention.

In a metallic decorative member 100 of each of FIGS. 1 and 2, a metal vapor deposited film 10 having a metal vapor deposited layer 12 on a transparent base material 11 is disposed such that the transparent base material 11 faces toward the outer layer side. In addition, the metal vapor deposited film 10 of the metallic decorative member 100 of FIG. 2 has a primer layer 13 between the transparent base material 11 and the metal vapor deposited layer 12. In addition, the metallic decorative member 100 of FIG. 2 has an adhesive layer 20 and a resin substrate 30 on the inner layer side of the metal vapor deposited film 10.

<Metal Vapor Deposited Film>

The metal vapor deposited film is one having the metal vapor deposited layer on the transparent base material.

A primer layer may be provided between the transparent base material and the metal vapor deposited layer for the purpose of improving adhesion.

<<Transparent Base Material>>

The transparent base material plays a role as a support of the metal vapor deposited layer. In addition, the transparent base material is disposed on the outer layer side and plays a role to give scratch resistance to the metallic decorative member.

In the present invention, a transparent resin base material containing rubber particles and a binder resin is used as the transparent base material.

By means of that the transparent base material contains rubber particles, the transparent base material is made hard to be cracked at the time of molding, and the moldability can be made favorable. Meanwhile, when the transparent base material contains rubber particles, the metallic luster is occasionally reduced due to the thermal treatment. It may be considered that the reason for this resides in the following (1).

(1) For the purpose of moisture discharge of the resin substrate to be laminated on the inner layer side of the metal vapor deposited film, or the like, the metallic decorative member is occasionally thermally treated before molding processing. On the occasion of thermal treatment before molding for the purpose of this moisture discharge, it may be considered that a minute dimensional change is generated in the vicinity of the surface of the transparent base material of the metal vapor deposited film. Specifically, it may be considered that in the transparent base material containing rubber particles, the thermal behavior is subtly different between a place where the rubber particles are present in the vicinity of the surface and a place where the rubber particles are not present in the vicinity of the surface. Then, it may be considered that due to a difference in thermal behavior of this minute region, island portions of the metal vapor deposited layer which are, in general, regularly aligned as shown in FIG. 3(a) and FIG. 4(a) are occasionally disordered as shown in FIG. 3(b) or FIG. 4(b), and in that case, the metallic luster reduced.

In the case where the metallic decorative member has other layer on the inner layer side of the metal vapor deposited film, such as the resin substrate, and high heat is applied to the transparent base material of the metal vapor deposited film in a process of forming the other layer, the aforementioned reduction of metallic luster is also occasionally generated due to the heat at this time. For example, in the case where the metallic decorative member has a resin substrate as mentioned later, when a metal sticky film and a resin substrate are laminated in a situation that high heat is applied to the transparent base material of the metal vapor deposited film, the aforementioned reduction of metallic luster is occasionally generated due to the heat at this time.

Then, when molding and thermal treatment are performed in the state that the island portions are disordered as mentioned above, it may be considered that the following (2) occurs.

(2) It may be considered that when the metallic decorative member is molded in a state that the island portions of the metal vapor deposited layer are superimposed as shown in FIG. 3(b), on the occasion when the metal vapor deposited layer is elongated, the metals in the superimposed island portions are damaged when peeled off, and the metallic luster further reduced. Then, since the island portions are damaged, the metallic luster is hardly recovered even by the thermal treatment after molding.

Meanwhile, it may be considered that when the metallic decorative member is molded in a state that the island portions of the metal vapor deposited layer are not superimposed as shown in FIG. 4(b), the reduction of metallic luster at the time of molding can be suppressed. Furthermore, due to the heat applied to the metallic decorative member at the time of molding (for example, heat on the occasion of subjecting the metallic decorative member to drawdown in vacuum molding), the island portions in which the alignment has been disordered become close to the original state, and the metallic luster is easily recovered.

In the thermal treatment before molding, there is a case where the alignment of the island portions of the metal vapor deposited layer is not so much disordered. While details will be mentioned later, by using a metal vapor deposited film having an area A per island portion falling within a specified range, the metal vapor deposited layer is easily smoothened due to heat and pressure at the time of molding, and the metallic luster after molding can be easily made excellent.

Although a fluctuation of the metallic luster due to the aforementioned movement of island portions in minute regions is hardly distinctly distinguished in terms of a specular glossiness that is a general-purpose measurement, it can be distinctly distinguished by human eyes due to distinctness of reflection of the background. Specifically, in the background where the metal vapor deposited layer reflects on the metal vapor deposited film in the state of FIG. 4(b), the contour can be viewed more clearly and distinctly, as compared with the background where the metal vapor deposited layer reflects on the metal vapor deposited film in the state of FIG. 3(b). In addition, examples of a method in which the fluctuation of the metallic luster due to the aforementioned movement of island portions in minute regions may be objectively measured include a method of measuring DOI (distinctness of image) using a wave scanning apparatus (trade name: Wave-Scan Dual AW-4840, manufactured by BYK Japan K.K.) or the like. It may be considered that the fluctuation of the metallic luster due to the movement of island portions in minute regions may also be measured in terms of a ratio of a mirror surface glossiness at 20° (G20) and a peak reflectance (Rspec). The peak reflectance (Rspec) refers to a glossiness in a narrow angle range of 20°±0.09905°.

Examples of a binder resin of the transparent base material include polyolefin-based resins, such as polyethylene and polypropylene; vinyl-based resins, such as polyvinyl chloride, polyvinylidene chloride, polyvinyl alcohol, an ethylene-vinyl acetate copolymer, and an ethylene-vinyl alcohol copolymer; polyester-based resins, such as polyethylene terephthalate, polyethylene naphthalate, and polybutylene terephthalate; acrylic resins, such as polymethyl (meth)acrylate and polyethyl (meth)acrylate; styrenic resins, such as polystyrene; and polyamide-based resins represented by nylon 6, nylon 66, or the like.

Of these resins, acrylic resins are suitable because they are excellent in light fastness, have high hardness so that they are hardly scratched, and are low in refractive index so that not only the transparency is excellent, but also scratches are less noticeable. The content of the acrylic resin is preferably 50% by mass or more, more preferably 70% by mass or more, and still more preferably 90% by mass or more relative to the whole of the binder resin of the transparent base material.

As for the acrylic resin as the binder resin, a homopolymer of a methacrylic acid ester and a copolymer comprising a methacrylic acid ester as a main component are suitable. As the methacrylic acid ester, an alkyl ester of methacrylic acid is typically used, and the alkyl moiety thereof may be in a degree of 1 to 4 carbon atoms. In the case of the copolymer, an acrylic acid ester, an aromatic vinyl compound, a vinyl cyanide compound, and so on are used.

Such an acrylic resin can be, for example, obtained through polymerization of 50 to 100% by weight of an alkyl methacrylate having an alkyl group having 1 to 4 carbon atoms, 0 to 50% by weight of an acrylic acid ester, and 0 to 49% by weight of other vinyl monomer which is copolymerizable with them. However, the acrylic acid ester is used in a proportion ranging preferably from 0.1 to 50% by weight, and more preferably from 1 to 50% by weight, and a copolymerization proportion of the alkyl methacrylate is preferably 50 to 99% by weight, and more preferably 55 to 99.9% by weight.

The rubber particle is a particle having an elastic layer.

From the viewpoint of transparency, the rubber particle preferably has a layer containing a resin of the same type as the binder resin in an outer shell of the elastic layer. In other words, from the viewpoint of transparency, the rubber particle preferably contains a resin of the same type as the binder resin in the outer shell thereof. For example, it is preferred that an acrylic resin is contained as the binder resin, and an acrylic resin is contained in the outer shell of the rubber particle.

From the viewpoint of making the transparency more favorable, it is preferred that the elastic layer of the rubber particle, the outer shell of the rubber particle, and the binder resin contain a component of the same type, respectively.

From the viewpoint of transparency, when a refractive index of the elastic layer of the rubber particle is designated as $n_0$, a refractive index of the outer shell of the rubber particle is designated as $n_1$, and a refractive index of the binder resin is designated as $n_2$, it is preferred that the following expression (A) is satisfied, and it is more preferred that the following expressions (A) and (B) are satisfied.

$$0.98 \leq n_1/n_2 \leq 1.02 \quad (A)$$

$$0.98 \leq n_0/n_1 \leq 1.02 \quad (B)$$

The rubber particle can be, for example, obtained by after obtaining an elastic polymer, polymerizing the component constituting the outer shell in the presence of the elastic polymer.

For example, by polymerizing 10 to 400 parts by weight of a monomer composition composed of 50 to 100% by weight of a methacrylic acid ester, 0 to 50% by weight of an acrylic acid ester, and 0 to 49% by weight of at least one other vinyl monomer which is copolymerizable with them in the presence of 100 parts by weight of an elastic copolymer having a layer obtained by polymerizing 50 to 99.9% by weight of an alkyl acrylate, 0 to 49.9% by weight of other vinyl monomer which is copolymerizable therewith, and 0.1 to 10% by weight of a copolymerizable crosslinkable monomer, a rubber-containing polymer provided with an outer shell (polymer layer formed of the monomer composition) on the surface of a core (layer containing the elastic copolymer) can be obtained.

The aforementioned rubber-containing polymer can be, for example, produced by polymerizing the aforementioned components for elastic copolymer through at least one-stage reaction by an emulsion polymerization method or the like, to obtain an elastic copolymer, and polymerizing the aforementioned monomers including the methacrylic acid ester through at least one-stage reaction by an emulsion polymerization method or the like in the presence of the elastic polymer. Due to such plural-stage polymerization, the monomers including the methacrylic acid ester to be used in the latter stage are graft-copolymerized in the elastic copolymer, to produce a crosslinked elastic copolymer having a graft chain. That is, this rubber-containing polymer becomes a graft copolymer having a multilayer structure containing the alkyl acrylate as the main component of rubber. In all of the case of performing the polymerization of the elastic copolymer through two or more stages or the case of performing the subsequent polymerization of the monomers composed of the methacrylic acid ester as the main component through two or more stages, it is adequate that the monomer composition as a whole rather than the monomer composition in each stage fall within the aforementioned range.

In the aforementioned rubber-containing polymer, examples of the alkyl acrylate which is used for constituting the elastic copolymer include those in which the alkyl moiety thereof has 1 to 8 carbon atoms. Above all, those in which the alkyl moiety thereof has 4 to 8 carbon atoms, such as butyl acrylate and 2-ethylhexyl acrylate, are preferred.

In the rubber-containing polymer, as the other vinyl monomer which is used for the purpose of constituting the elastic copolymer, if desired and which is copolymerizable with the alkyl acrylate, alkyl methacrylates, such as methyl methacrylate, ethyl methacrylate, butyl methacrylate, and cyclohexyl methacrylate; styrene, acrylonitrile, and so on are preferred.

In the rubber-containing polymer, the copolymerizable crosslinkable monomer which is used for the purpose of constituting the elastic copolymer may be a monomer having at least two polymerizable carbon-carbon double bonds in one molecule thereof. Examples thereof include unsaturated carboxylic acid diesters of a glycol, such as ethylene glycol dimethacrylate and butanediol dimethacrylate; alkenyl esters of an unsaturated carboxylic acid, such as allyl acrylate, allyl methacrylate, and allyl cinnamate; polyalkenyl esters of a polybasic acid, such as diallyl phthalate, diallyl maleate, triallyl cyanurate, and triallyl isocyanurate; unsaturated carboxylic acid esters of a polyhydric alcohol, such as trimethylolpropane triacrylate; and divinylbenzene. Above all, alkenyl esters of an unsaturated carboxylic acid and polyalkenyl esters of a polybasic acid are preferred. Each of these crosslinkable monomers can be used alone or in combination of two or more thereof as the need arises.

The methacrylic acid ester to be grafted in the elastic copolymer is preferably an alkyl ester of methacrylic acid, and examples thereof include methyl methacrylate, ethyl methacrylate, butyl methacrylate, 2-ethylhexyl methacrylate, and cyclohexyl methacrylate. Examples of the acrylic acid ester include alkyl acrylates, such as methyl acrylate, butyl acrylate, and cyclohexyl acrylate. Although the other vinyl monomer which is copolymerizable with the methacrylic acid ester and/or acrylic acid ester is not particularly limited, examples thereof include styrene and acrylonitrile.

The monomer to be grafted is used in an amount of preferably 10 to 400 parts by weight, and more preferably 20 to 200 parts by weight based on 100 parts by weight of the elastic copolymer, and it can be polymerized through at least one-stage reaction. Here, when the use amount of the monomer to be grafted is regulated to 10 parts by weight or more, coagulation of the elastic copolymer is hardly generated, and the transparency becomes favorable.

A rigid polymer layer composed mainly of a methacrylic acid ester can be provided on the more inner side of the aforementioned elastic copolymer layer. In this case, the rigid polymer layer may be prepared by first polymerizing a monomer of a rigid layer constituting an innermost layer, polymerizing the aforementioned monomers constituting the elastic copolymer in the presence of the obtained rigid polymer, and further polymerizing the monomer to be grafted and composed mainly of the aforementioned methacrylic acid ester in the presence of the obtained elastic copolymer. Here, the rigid layer serving as the innermost layer is preferably one prepared by polymerizing a monomer consisting of 70 to 100% by weight of a methacrylic acid ester and 0 to 30% by mass of other vinyl monomer copolymerizable therewith. On this occasion, it is also effective to use a copolymerizable crosslinkable monomer as one of the other vinyl monomers. As the methacrylic acid ester, an alkyl methacrylate, and especially methyl methacrylate is effective.

An average particle diameter of the rubber particle is preferably 0.05 to 0.40 μm, and more preferably 0.10 to 0.30 μm. When the average particle diameter of the rubber particle is regulated to 0.05 μm or more, the impact resistance of the transparent base material can be easily made favorable, and when the average particle diameter of the rubber particle is regulated to 0.40 μm or less, the transparency of the transparent base material can be easily made favorable. As the rubber particle, two kinds of rubber particles having a different average particle diameter from each other may also be used.

The average particle diameter of the rubber particle can be, for example, obtained by vertically cutting the transparent base material to produce a sample, dyeing rubber particles or a material other than the rubber particles of the sample with a dyeing agent, such as ruthenium oxide, imaging a transmission electron image of the dyed sample with an electron microscope, and calculating an average value of diameters of the imaged 20 particles.

It is possible to set the average particle diameter of the rubber particle to an appropriate value by regulating the kind or amount of a polymerization initiator, a polymerization time, and the like.

As for a blending ratio of the binder resin and the rubber particles in the transparent base material, the amount of the rubber particles is preferably 10 to 1,000 parts by mass, more preferably 40 to 600 parts by mass, and still more preferably 100 to 250 parts by mass based on 100 parts by mass of the binder resin from the viewpoint of making the moldability favorable while maintaining the function of the binder resin (for example, a high surface hardness of the acrylic resin).

On the occasion of heating the transparent base material at 75° C. for 30 minutes, its thermal shrinkage ratio is preferably 1.0% or less, more preferably 0.7% or less, and still more preferably 0.5% or less. By reducing the thermal shrinkage ratio of the transparent base material, it can become easy to prevent the island portions of the metal vapor deposited layer from the occurrence of the matter such that they become in a state shown in FIG. 3(b) due to heating before molding, and the metallic luster after molding can be easily made excellent.

In this specification, the thermal shrinkage ratio at 75° C. for 30 minutes is one as measured in conformity with JIS K7133:1999 and means an average in the MD direction and the TD direction.

A thickness of the transparent base material is preferably 50 to 250 μm, more preferably 60 to 200 μm, and still more preferably 70 to 150 μm from the viewpoint of a balance between moldability and protection of the metal vapor deposited layer.

The thickness of the transparent base material can be, for example, measured through observation of a vertical cross section with an electron microscope or the like.

A haze of the transparent base material in conformity with JIS K7136:2000 is preferably 5% or less, more preferably 3% or less, and still more 1% or less.

In addition, a total light transmittance of the transparent base material in conformity with JIS K7361-1:1997 is preferably 85% or more, and more preferably 90% or more.

In the transparent base material, arbitrary additives, for example, a photostabilizer, such as a UV absorber, an antioxidant, a lubricant, and an antistatic agent, can also be added, as the need arises.

<<Metal Vapor Deposited Layer>>

Examples of the metal constituting the metal vapor deposited layer include metals, such as indium, tin, aluminum, nickel, copper, silver, gold, platinum, brass, chromium, and zinc, and alloys thereof. Of these, at least one selected from indium, tin, aluminum, zinc, and alloys thereof is preferably used.

An indium vapor deposited layer is most preferred from the standpoint that it is favorable in weather resistance while it is excellent in metallic luster. Furthermore, since indium has a low melting point, the indium vapor deposited layer tends to easily take the aforementioned island-like structure. Accordingly, the case where the metal vapor deposited layer is an indium vapor deposited layer is effective from the standpoint that the effects of the present invention are easily exhibited.

Examples of a method of forming the metal vapor deposited layer include physical vapor deposition (PVD) methods, such as a vacuum vapor deposition method, a sputtering method, and an ion plating method. Of these, a vacuum vapor deposition method which is adoptable to any materials is preferred. That is, examples of the metal vapor deposited layer include physical vapor deposited layers, and above all, a vacuum vapor deposited layer is preferred.

In the present invention, the metal vapor deposited layer is to be formed such that an area A per island portion is 4,400 to 56,000 nm$^2$.

In the case where the area A per island portion of the metal vapor deposited layer is less than 4,400 nm$^2$, the metallic luster is insufficient, so that the designability of the metallic decorative molded body cannot be made favorable.

Meanwhile, in the case where the area A per island portion of the metal vapor deposited layer is more than 56,000 nm$^2$, the density of the island portions of the metal vapor deposited layer becomes excessively high, and the island portions of the metal vapor deposited layer are liable to become in the state shown in FIG. 3(b) due to heating before molding, so that the metallic luster after molding cannot be made excellent. In addition, in the case where the area A per island portion of the metal vapor deposited layer is more than 56,000 nm², even when heat is applied to the metallic decorative member at the time of molding, the island portions in which the alignment has been disordered hardly become close to the original state, so that the metallic luster is hardly recovered.

In the case where the area A per island portion of the metal vapor deposited layer is more than 56,000 nm², even when the island portions of the metal vapor deposited layer have not become in the state shown in FIG. 3(b) due to heating before molding, the metallic luster after molding cannot be made favorable. As for the reason for this, it may be considered that in the case where the area A per island portion of the metal vapor deposited layer is more than 56,000 nm², the metal vapor deposited layer is hardly smoothened due to heat and pressure at the time of molding.

The area A per island portion of the metal vapor deposited layer is preferably 17,500 to 53,000 nm², more preferably 24,000 to 51,000 nm², and still more preferably 31,500 to 49,000 nm².

In this specification, the area A per island portion is one calculated by the following method.

First of all, a surface photograph of the metal vapor deposited layer of the metal vapor deposited film is taken with a scanning electron microscope (SEM). A photographing magnification is preferably 5,000 to 20,000 times.

Subsequently, a square frame into which 50 or more and 100 or less island portions are able to enter is superimposed on the taken photograph. A length of one side of the frame is designated as L [nm]. "L" expresses an actual size on the sample, and for example, it can be calculated on the basis of a pixel size or scale bar of the SEM photograph.

Subsequently, the number ($n_1$) of island portions which are entirely contained within the frame, the number ($n_2$) of island portions which are perceived to exist in a proportion of ½ or more and less than 1 of the area of the island portions within the frame, and the number ($n_3$) of island portions which are perceived to exist in a proportion of less than ½ of the area of the island portions within the frame are counted. "n" expressed by the following equation (i) on the basis of the counted $n_1$, $n_2$, and $n_3$ is made fictitious as the number of island portions existing within the frame.

$$n=n_1+(3n_2+n_3)/4 \quad \text{(i)}$$

"a" expressed by the following equation (ii) on the basis of the length L [nm] of one side of the frame and the number (n) of island portions within the frame as calculated by the equation (i) is made fictitious as an area [nm²] per island portion within the frame. The thus calculated area a [nm²] per island portion slightly includes an area of the sea portions. But, as shown in FIGS. 5 and 6, the area occupied by the sea portions within the plane is slight and is small to an extent such that influences against the area a [nm²] per island portion and the metallic luster after molding are negligible, and therefore, in this specification, any influences of the sea portions are to be discounted.

$$a=L^2/n \quad \text{(ii)}$$

The aforementioned operation is implemented in 20 places, and an average value of "a" in the 20 places is designated as the area A [nm²] per island portion in this specification.

The area A per island portion can be, for example, regulated by a time of vapor deposition (when the vapor deposition time is made long, the area A increases). In addition, it is preferred to carry out the observation with a scanning electron microscope (SEM) after thoroughly familiarizing the vapor deposited film in the environment at a temperature of 23° C.±5° C. and a humidity of 40 to 65%. In addition, an accelerating voltage of the scanning electron microscope (SEM) at the time of photographing is preferably regulated within a range of 1 to 5 kV, and a pixel size of the image is preferably regulated to 5.0 to 10 nm.

<<Primer Layer>>

In order to enhance adhesion of the metal vapor deposited layer, a primer layer is preferably provided between the transparent base material and the metal vapor deposited layer. In addition, the primer layer is able to suppress transfer of a difference in thermal behavior in a minute region of the transparent base material into the metal vapor deposited layer and is able to easily suppress the disorder of alignment of the island portions of the metal vapor deposited layer at the time of heating before molding. In addition, the suppression of disorder of the alignment of the island portions of the metal vapor deposited layer at the time of heating before molding is effective from the standpoint that the island portions in which the alignment has been disordered easily become close to the original state due to heat applied to the metallic decorative member at the time of molding, leading to recovery of the metallic luster.

The primer layer can be constituted of a resin of every kind, for example, an acrylic resin, a vinyl chloride-based resin, a vinyl acetate-based resin, a polyester-based resin, and a urethane-based resin.

As the resin constituting the primer layer, it is preferred to select a resin capable of enhancing adhesion between the transparent base material and the metal vapor deposited layer. For example, in the case where the binder resin of the transparent base material is an acrylic resin, the primer layer preferably contains an acrylic resin.

Preferably, the primer layer contains a cured product of a resin composition. When the primer layer contains a cured product of a resin composition, the transfer of a difference in thermal behavior in a minute region of the transparent base material into the metal vapor deposited layer can be more suppressed, and the occurrence of disorder of the alignment of the island portions of the metal vapor deposited layer at the time of heating before molding can be easily suppressed.

Examples of the cured product of a resin composition include a reaction product (cured product) between an acrylic polyol as a main agent and an isocyanate compound as a curing agent. The cured product is also suitable from the standpoint that it may make adhesion to the transparent base material containing an acrylic resin as a binder resin favorable.

The acrylic polyol is not particularly restricted so long as it is an acrylic polymer having at least two hydroxy groups in a molecule thereof. The acrylic polyol is preferably a copolymer obtained through copolymerization of a hydroxy group-containing acrylate and a copolymerizable vinyl monomer which is copolymerizable with the hydroxy group-containing acrylate.

Examples of the hydroxy group-containing acrylate include 2-hydroxyethyl (meth)acrylate, hydroxypropyl (meth)acrylate, hydroxybutyl (meth)acrylate, 2,2-dihydroxymethylbutyl (meth)acrylate, a polyhydroxyalkyl maleate, and a polyhydroxyalkyl fumarate, with 2-hydroxyethyl (meth)acrylate or the like being preferred.

Examples of the copolymerizable vinyl monomer include alkyl (meth)acrylates, such as methyl (meth)acrylate, ethyl (meth)acrylate, propyl (meth)acrylate, isopropyl (meth) acrylate, butyl (meth)acrylate, isobutyl (meth)acrylate, s-butyl (meth)acrylate, t-butyl (meth)acrylate, and pentyl (meth)acrylate. In addition, examples thereof further include aromatic vinyl compounds, such as styrene, vinyltoluene, and α-methylstyrene; cyan vinyl compounds, such as (meth)acrylonitrile; vinyl monomers containing a carboxy group, such as (meth)acrylic acid, fumaric acid, maleic acid, and itaconic acid, or alky esters thereof; and alkane polyol poly(meth)acrylates, such as ethylene glycol di(meth)acrylate, butylene glycol di(meth)acrylate, hexanediol di(meth)acrylate, oligoethylene glycol di(meth)acrylate, trimethylolpropane di(meth)acrylate, and trimethylolpropane tri(meth)acrylate.

The acrylic polyol can be obtained by copolymerizing such hydroxy group-containing acrylate and copolymerizable vinyl monomer in the presence of appropriate solvent and polymerization initiator.

A number average molecular weight of the acrylic polyol is preferably 5,000 to 50,000, and more preferably 10,000 to 30,000. The number average molecular weight of the acrylic polyol is a molecular weight as measured by the gel permeation chromatography (GPC) as expressed in terms of polystyrene.

As the isocyanate compound, various isocyanate compounds, such as aromatic or aliphatic compounds, and so on can be used. The isocyanate compound is preferably at least one selected from tolylene diisocyanate (TDI), diphenylmethane diisocyanate (MDI), xylylene diisocyanate (XDI), hexamethylene diisocyanate (HDI), and isophorone diisocyanate (IPDI). Of these, TDI is more preferred.

A molar ratio of the isocyanate group of the isocyanate compound to the hydroxy group of the acrylic polyol ((isocyanate group)/(hydroxy group)) is preferably 0.5 to 5.0, more preferably 0.6 to 3.0, and still more preferably 0.7 to 2.0. When the foregoing molar ratio is 0.5 or more, the condition 1 can be easily satisfied, whereas when the foregoing molar ratio is 5.0 or less, the generation of a crack at the time of molding can be easily suppressed.

A thickness of the primer layer is preferably 0.5 to 10 μm, and more preferably 1 to 5 μm.

An additive, such as a UV absorber and a photostabilizer, may be contained in the primer layer.

<Other Layers>

The metallic decorative member may have other layers than those as exemplified above.

<<Protective Layer>>

The metallic decorative member may have a protective layer on the outer layer side of the metal vapor deposited film (outer layer side of the transparent base material).

Preferably, the protective layer contains a cured product of a curable resin composition from the viewpoint of scratch resistance. Examples of the cured product of a curable resin composition include a cured product of a thermosetting resin composition and a cured product of an ionizing radiation curable resin composition. Of these, a cured product of an ionizing radiation curable resin composition is preferred.

The thermosetting resin composition is a composition containing at least a thermosetting resin and is a resin composition which is cured upon heating. Examples of the thermosetting resin include an acrylic resin, a urethane resin, a phenol resin, a urea melamine resin, an epoxy resin, an unsaturated polyester resin, and a silicone resin. In the thermosetting resin composition, a curing agent is added to such a thermosetting resin, as the need arises.

The ionizing radiation curable resin composition is a composition containing a compound having an ionizing radiation curable functional group (hereinafter also referred to as "ionizing radiation curable compound"). Examples of the ionizing radiation curable functional group include an ethylenically unsaturated binding group, such as a (meth)acryloyl group, a vinyl group, and an allyl group; and an epoxy group and an oxetanyl group.

The ionizing radiation curable resin is preferably a compound having an ethylenically unsaturated binding group. In addition, from the viewpoint of suppressing scratching of the resin layer in a process of producing a metallic decorative member, the ionizing radiation curable resin is more preferably a compound having at least two ethylenically unsaturated binding groups. Above all, a polyfunctional (meth)acrylic compound having at least two ethylenically unsaturated binding groups is still more preferred. As the polyfunctional (meth)acrylic compound, all of monomers and oligomers can be used.

The ionizing radiation means one among electromagnetic waves or charged particle beams having an energy quantum capable of polymerizing or crosslinking a molecule. Typically, an ultraviolet ray (UV) or an electron beam (EB) is used. Besides, it is also possible to use electromagnetic waves, such as an X-ray and a γ-ray, and charged particle beams, such as an α-ray and an ion beam.

A thickness of the protective layer is preferably 0.5 to 30 μm, more preferably 1 to 20 μm, and still more preferably 3 to 10 μm.

<<Resin Substrate>>

Preferably, a resin substrate is provided on the inner layer side of the metal vapor deposited film of the metallic decorative member.

The resin substrate has a role of, for example, enhancing the strength of the metallic decorative member, or maintaining a shape of the metallic decorative molded body formed of the metallic decorative member.

A thickness of the resin substrate is not particularly restricted, and for example, it may be appropriately selected within a range of 0.1 to 10 mm. A plurality of resin substrates may be provided on the inner layer side of the metal vapor deposited film.

Although the resin substrate may be transparent, in order to suppress surface reflection of the resin substrate, it is preferably a neutral color other than a white color (e.g., gray or black color), and more preferably a black color.

Accordingly, the resin substrate preferably contains a pigment for revealing a neutral color. The pigment of the resin substrate may be a black pigment alone or may also be a mixture of a black pigment and other pigment (e.g., a white pigment).

Examples of the binder resin of the resin substrate include a polyolefin-based resin, such as polyethylene, polypropylene, polybutene, polymethylpentene, an ethylene-propylene copolymer, an ethylene-propylene-butene copolymer, and an olefin-based thermoplastic elastomer, an ABS (acrylonitrile-butadiene-styrene copolymer) resin, a styrene resin, a vinyl chloride resin, an acrylic resin, and a polycarbonate resin.

Of these binder resins, an ABS resin is preferably contained from the viewpoint of suppressing a crack at the time of molding.

A proportion of the ABS resin relative to the whole binder resin of the resin substrate is preferably 50% by mass or more, more preferably 70% by mass or more, and still more preferably 90% by mass or more.

To the resin substrate, arbitrary additives, for example, a photostabilizer, such as a UV absorber, a plasticizer, a filler, an antioxidant, a lubricant, and an antistatic agent, can also be added, as the need arises.

On the occasion of heating the resin substrate at 75° C. for 30 minutes, its thermal shrinkage ratio is preferably 1.0% or less, more preferably 0.5% or less, and still more preferably 0.1% or less. By reducing the thermal shrinkage ratio of the resin substrate, it can become easy to suppress the reduction of metallic luster to be caused due to the resin substrate.

<<Adhesive Layer>>

An adhesive layer is a layer to be formed for the purpose of enhancing the adhesiveness to each of the layers constituting the metallic decorative member, as the need arises. For example, the adhesive layer is preferably disposed between the metal vapor deposited film and the resin substrate. In addition, in the case where a plurality of resin substrates are provided, the adhesive layer is preferably disposed between the resin substrates.

Examples of the adhesive layer include a heat-sensitive adhesive layer (heat seal layer) and a pressure-sensitive adhesive layer (sticky layer). The pressure-sensitive adhesive layer (sticky layer) is more preferred from the standpoint of simplicity of a sticking process. The heat-sensitive adhesive layer (heat seal layer) is preferred from the standpoint of easily making the metallic luster after molding more favorable because the shape is hardly changed as compared with the pressure-sensitive adhesive layer (sticky layer).

As the heat-sensitive or pressure-sensitive resin, general-purpose acrylic resins, urethane-based resins, polyester-based resins, silicone-based resins, vinyl chloride-based resins, or vinyl acetate-based resins, or a mixture or copolymer of two or more thereof can be used.

A thickness of the adhesive layer may be regulated within a range of about 0.1 to 100 μm according to the kind of the adhesive.

<Laminate Configuration of Metallic Decorative Member>

Specific examples of a laminate configuration of the metallic decorative member include the following (1) to (4). The term "/" means a boundary between the respective layers. In addition, the left side means the outer layer side of the metallic decorative member, and the right side means the inner layer side of the metallic decorative member.

(1) (Transparent base material)/(Metal vapor deposited layer)
(2) (Transparent base material)/(Primer layer)/(Metal vapor deposited layer)
(3) (Transparent base material)/(Metal vapor deposited layer)/(Adhesive layer)/(Resin substrate)
(4) (Transparent base material)/(Primer layer)/(Metal vapor deposited layer)/(Adhesive layer)/(Resin substrate)

Preferably, the metallic decorative member of the present invention is further satisfied with the following condition 1.

<Condition 1>

A value of distinctness of image as measured from the outer layer side of the metallic decorative member by using a wave scanning apparatus is designated as "D1". Subsequently, the metallic decorative member in which D1 is measured is dried at 75° C. for 72 hours. After allowing to stand for cooling until the surface temperature on the outer layer side of the metallic decorative member reaches room temperature, a value of distinctness of image as measured from the outer layer side of the dried metallic decorative member by using a wave scanning apparatus is designated as "D2". Subsequently, the metallic decorative member in which D2 is measured is subjected to vacuum molding. After allowing to stand for cooling until the surface temperature on the outer layer side of the metallic decorative member reaches room temperature, a value of distinctness of image as measured from the outer layer side of the vacuum-molded metallic decorative member by using a wave scanning apparatus is designated as "D3". On such assumption, it exhibits a relation of [(D2/D1)<(D3/D1)].

What the condition 1 while expressing the relation of [(D2/D1)<(D3/D1)] is satisfied expresses that the distinctness of image after molding is more favorable than the distinctness of image after heating before molding. For example, it is expressed that (1) the distinctness of image reduced due to heating (drying at 75° C. for 72 hours) before molding is recovered by heat at the time of vacuum molding (heat on the occasion of subjecting the metallic decorative member to drawdown); (2) while the distinctness of image before and after heating before molding is equal, the distinctness of image becomes favorable through vacuum molding; and so on. In consequence, when the condition 1 is satisfied, the metallic luster expected at the beginning can be realized.

(D3/D1) is preferably 0.950 or more, and more preferably 0.960 or more. Although an upper limit of (D3/D1) is not particularly limited, in the case of the aforementioned (1), it is about 0.999, and in the case of the aforementioned (2), it is about 1.150.

(D2/D1) is preferably 0.880 or more, and more preferably 0.900 or more. Although an upper limit of (D2/D1) is not particularly limited, in the case of the aforementioned (1), it is about 0.990, and in the case of the aforementioned (2), it is about 1.050.

In the metallic decorative member of the present invention, (D3/D2) is preferably 1.030 or more, and more preferably 1.050 or more. Although an upper limit of (D3/D2) is not particularly limited, it is about 1.150.

In the condition 1, D1 (distinctness of image of the metallic decorative member in an initial state) is preferably measured in the environment at a temperature of 23° C.±5° C. and a humidity of 40 to 65%. In the case where the metallic decorative member has other layer, such as the resin substrate, on the inner layer side of the metal vapor deposited film, and high heat is applied to the transparent base material of the metal vapor deposited film in a process of forming the foregoing other layer, it is preferred to measure the D1 in the configuration of the state before application of such heat. The high heat is, for example, heat at 70° C. or higher.

In the condition 1, after vacuum molding of the metallic decorative member, the resulting metallic decorative member is preferably allowed to stand for cooling in the environment at a temperature of 23° C.±5° C. and a humidity of 40 to 65%. In addition, in the condition 1, the room temperature means 23° C.±5° C.

In the condition 1, a heating condition at the time of vacuum molding is preferably a condition under which a surface temperature of the metallic decorative member reaches 180° C. for 170 seconds.

In the condition 1, the place at which D3 is measured is preferably a place at which a rate of elongation is 50% or less, and more preferably a place at which a rate of elongation is 30% or less. In a corner portion of unevenness of the molded body, an angle of inclination inflects taking the corner portion as the boundary. In the case wherein an inflected inclined surface is contained in a measuring region, an accurate measurement of the distinctness of image cannot be expected. Accordingly, the place containing a region in which the angle of inclination inflects is not subject to the measurement of D3.

In the condition 1, D1, D2, and D3 are each an average value of measured values in 20 places.

<Application of Metallic Decorative Member>

The metallic decorative member of the present invention can be suitably used for various molded bodies which are required to have high-level designability (for example, members of communication equipment, interiors and exteriors of vehicles, such as automobiles, household appliances, furniture, and the like).

[Metallic Decorative Molded Body]

The metallic decorative molded body of the present invention is one formed of the aforementioned metallic decorative member of the present invention.

<Production Method of Metallic Decorative Molded Body>

The metallic decorative molded body can be produced through vacuum molding including the following steps (y1) to (y2).

(y1) The metallic decorative member is placed on a molding die having a molding surface of a predetermined shape, and then, the metallic decorative member is heated and softened (the metallic decorative member is subjected to drawdown on the molding die). In the case where the molding die is a male die, the metallic decorative member is disposed such that the inner layer side thereof faces toward the molding die (male die) side, whereas in the case where the molding die is a female die, the metallic decorative member is disposed such that the outer layer side thereof faces toward the molding die (female die) side.

(y2) Vacuum suction is performed from the molding die side to intimately contact the softened metallic decorative member along the molding surface of the molding die, thereby molding the metallic decorative member.

Prior to the step (y1), after fabricating a laminate in which the inner layer side of the metallic decorative member is stuck with an adherend, the laminate may be subjected to vacuum molding. In addition, in the case where the metallic decorative member has a resin substrate, it is preferred to perform a moisture removal step by heating prior to the step (y1).

EXAMPLES

The present invention is hereunder specifically described by reference to Examples and Comparative Examples, but it should be construed that the present invention is not limited to the embodiments described in the Examples.

1. Measurement and Evaluation

The metallic decorative member was measured and evaluated in the following manners. The results are shown in Table 1.

1-1. Calculation of Area A Per Island Portion of Metal Vapor Deposited Layer

According to the procedures described in the specification body, a surface photograph of the metal vapor deposited layer of the metal vapor deposited film was taken with a scanning electron microscope (SEM), and an area A [$nm^2$] per island portion of the metal vapor deposited layer was calculated. Model No. S-4800, manufactured by Hitachi High-Technologies Corporation was used as a scanning electron microscope (SEM), and an accelerating voltage was set to 5 kV, a pixel size was set to 9.9 nm, and a working distance (WD) was set to 15.0 mm.

1-2. Initial Metallic Luster

The metallic luster of the metallic decorative member in an initial state that heating before molding was not performed was evaluated through visual inspection. The case where the metallic luster is favorable is given "2 points"; the case where it cannot be said whether or not the metallic luster is favorable is given "1 point"; and the case where the metallic luster is insufficient is given "0 point". The evaluation was performed by 20 persons, and an average score was calculated. Ranking was made for every average score on the following basis.

A: The average score is 1.5 or more.
B: The average score is 1.0 or more and less than 1.5.
C: The average score is less than 1.0.

1-3. Change of Distinctness of Reflection

Using a wave scanning apparatus (trade name: Wave-Scan Dual AW-4840, manufactured by BYK Japan K.K.), the distinctness of image (D1) was measured from the transparent base material side of the metallic decorative member (metallic decorative member having not been thermally treated before molding) of each of Examples 1 to 7 and Comparative Example 1. The display item of the distinctness of image on the aforementioned measuring apparatus is "DOI" (Distinctness of Image). Similarly, the distinctness of image (D2) was measured from the transparent base material side of the metallic decorative member having been thermally treated before molding of each of Examples 1 to 7 and Comparative Example 1. Furthermore, the distinctness of image (D3) of the metallic decorative molded body of each of Examples 1 to 7 and Comparative Example 1 was measured. The place at which D3 was measured was selected from regions where the rate of elongation was 30% or less.

"D2/D1", "D3/D1", and "D2/D3" are shown in Table 1. When "D3/D1" is 0.950 or more, the change in distinctness from the initial DOI is small, and it may be said that the expected metallic luster after molding can be maintained.

Since the metallic decorative member of Comparative Example 2 was inferior in the initial metallic luster, a series of measurements of DOI were not performed.

1-4. Metallic Luster after Molding

The metallic luster of the metallic decorative member after molding (metallic decorative molded body fabricated in "3" as mentioned later) was evaluated through visual inspection. The case where the metallic luster is favorable is given "2 points"; the case where it cannot be said whether or not the metallic luster is favorable is given "1 point"; and the case where the metallic luster is insufficient is given "0 point". The evaluation was performed by 20 persons, and an average score was calculated. Ranking was made for every average score on the following basis.

AA: The average score is 1.7 or more.
A: The average score is 1.5 or more and less than 1.7.
B: The average score is 1.0 or more and less than 1.5.
C: The average score is less than 1.0.

2. Fabrication of Metallic Decorative Member

Example 1

On a transparent base material made of a 125 µm-thick acrylic resin film and containing acrylic rubber particles (product No.: "015NAH", manufactured by Kaneka Corporation, total light transmittance: 92%, haze: 0.6%, thermal shrinkage ratio at 75° C. for 30 minutes:0.5% or less), a primer layer-forming coating liquid 1 as mentioned below was coated and dried, to form a primer layer having a thickness of 2 µm. A molar ratio of the isocyanate group to the hydroxy group in the primer layer-forming coating liquid 1 was 1/1.

Subsequently, an indium vapor deposited layer was formed on the primer layer by the vacuum vapor deposition method by regulating the vapor deposition time such that the area A [nm²] per island portion of the metal vapor deposited layer became a value shown in Table 1, thereby obtaining a metal vapor deposited film.

Subsequently, 100 parts by mass of an acrylic pressure-sensitive adhesive (trade name: SK-Dyne 2094, manufactured by Soken Chemical & Engineering Co., Ltd., solids content: 25% by mass) was mixed with 0.27 parts by mass of an epoxy-based crosslinking agent (trade name: E-AX, manufactured by Soken Chemical & Engineering Co., Ltd., solids content: 5% by mass), to obtain a composition for adhesive layer. On the release-treated surface of a silicone release-treated polyester film having a thickness of 38 μm (trade name: E7304, manufactured by Toyobo Co., Ltd.), the composition for adhesive layer was coated and dried such that the thickness after drying was 40 μm, to form a pressure-sensitive adhesive layer.

Subsequently, the pressure-sensitive adhesive layer was stuck with the indium vapor deposited layer side of the metal vapor deposited film, to obtain a laminate. The laminate was subjected to an aging treatment in an environment at 40° C. for 3 days. Thereafter, the silicone release-treated polyester film having a thickness of 38 μm was peeled off, the exposed pressure-sensitive adhesive layer was stuck with a resin substrate (3.0 mm-thick black ABS resin film, thermal shrinkage ratio at 100° C.:2% or less), to obtain a metallic decorative member of Example 1.

<Primer Layer-Forming Coating Liquid 1>
  Acrylic polyol: 100 parts by mass
    (Trade name: ARACOAT DA105, manufactured by Arakawa Chemical Industries, Ltd.)
  Isocyanate-based compound: 40 parts by mass
    (Trade name: ARACOAT CL102H, manufactured by Arakawa Chemical Industries, Ltd.)
  Methyl ethyl ketone: 25 parts by mass
  Butyl acetate: 20 parts by mass Examples 2 to 3

Metallic decorative members of Examples 2 to 3 were obtained in the same manner as in Example 1, except for changing the area A [nm²] per island portion to a value shown in Table 1.

Example 4

On a transparent base material made of a 125 μm-thick acrylic resin film and containing acrylic rubber particles (trade name: "TECHNOLLOY (registered trademark) S001G", manufactured by Sumitomo Chemical Co., Ltd., total light transmittance: 92%, haze: 1.3%, thermal shrinkage ratio at 100° C. for 10 minutes:0.5% or less), the aforementioned primer layer-forming coating liquid 1 was coated and dried, to form a primer layer having a thickness of 2 μm.

Subsequently, an indium vapor deposited layer was formed on the primer layer by the vacuum vapor deposition method by regulating the vapor deposition time such that the area A [nm²] per island portion of the metal vapor deposited layer became a value shown in Table 1, thereby obtaining a metal vapor deposited film.

Subsequently, on the indium vapor deposited layer, a coating liquid for pressure-sensitive adhesive layer having a formulation as mentioned below was coated and dried such that the thickness after drying was 1.2 μm, to form a pressure-sensitive adhesive layer. There was thus obtained a laminate A having the pressure-sensitive adhesive layer on the indium vapor deposited layer of the metal vapor deposited film.

Subsequently, on a resin substrate (3.0 mm-thick black ABS resin film, thermal shrinkage ratio at 100° C.:2% or less), the laminate A was disposed such that the surface on the pressure-sensitive adhesive layer side faced toward the resin substrate side, and the resin substrate and the laminate A were thermally laminated, to obtain a metallic decorative member of Example 4.

<Coating Liquid for Pressure-Sensitive Adhesive Layer>

A mixture of 100 parts by mass of an acrylic pressure sensitive adhesive (trade name: T-14, manufactured by Showa Ink Manufacturing Co., Ltd., solids content: 30% by mass) with 5 parts by mass of an isocyanate-based crosslinking agent (trade name: OPNo. 81, manufactured by Showa Ink Manufacturing Co., Ltd., solids content: 70% by mass).

Examples 5 to 7

Metallic decorative members of Examples 5 to 7 were obtained in the same manner as in Example 4, except for changing the area A [nm²] per island portion to a value shown in Table 1.

Comparative Examples 1 to 2

Metallic decorative members of Comparative Examples 1 to 2 were obtained in the same manner as in Example 1, except for changing the vapor deposition time to change the area A [nm²] per island portion to a value shown in Table 1.

3. Thermal Treatment Before Molding and Fabrication of Metallic Decorative Molded Body Each of the metallic decorative members of the Examples and Comparative Examples was heated and dried at 75° C. for 72 hours, to discharge the moisture of the resin substrate.

Subsequently, using a die having a desired molding shape, the metallic decorative member was disposed such that the surface on the resin substrate (black ABS resin film) side faced toward the die and subjected to vacuum molding (heating condition: condition under which the surface temperature of the resin substrate became 180° C. for 170 seconds). There were thus obtained metallic decorative molded bodies of Examples 1 to 7 and Comparative Examples 1 to 2.

Each of the obtained metallic decorative molded bodies was observed from the transparent base material side through visual inspection in a room under illumination with a fluorescent lamp. As a result, in all of the samples, crack could not be confirmed. The DOI in the above 1-3 was measured from the surface on the transparent base material side of each of the metallic decorative molded bodies of Examples 1 to 7 and Comparative Example 1.

TABLE 1

| | Area A per island portion [nm²] | Initial metallic luster | Change in distinctness (DOI) | | | Metallic luster after molding |
|---|---|---|---|---|---|---|
| | | | D2/D1 | D3/D2 | D3/D1 | |
| Example 1 | 41.187 | A | 0.902 | 1.077 | 0.972 | A |
| Example 2 | 38.360 | A | 0.903 | 1.081 | 0.976 | A |
| Example 3 | 53.502 | A | 0.923 | 1.038 | 0.958 | A |
| Example 4 | 19.322 | A | 1.010 | 1.070 | 1.080 | AA |
| Example 5 | 25.750 | A | 1.000 | 1.070 | 1.070 | AA |
| Example 6 | 40.162 | A | 1.010 | 1.040 | 1.040 | AA |
| Example 7 | 49.724 | A | 1.000 | 1.080 | 1.080 | AA |
| Comparative Example 1 | 58.535 | A | 0.947 | 0.997 | 0.944 | B |
| Comparative Example 2 | 3.019 | C | — | — | — | C |

From the results of Table 1, it can be confirmed that according to the metallic decorative member of the Examples, the D3/D1 is 0.950 or more, the metallic luster of the metallic decorative molded body obtained by molding can be made excellent, and the metallic luster after molding is hardly reduced. In addition, in view of the fact that the metallic decorative members of the Examples exhibit the relation of [(D2/D1)<(D3/D1)], it can be confirmed that the distinctness (metallic luster) before molding which has been reduced by heating or maintained is recovered due to heat, etc. applied to the metallic decorative member at the time of molding.

In addition, in the metallic decorative members of Examples 4 to 7, it can be confirmed that the aforementioned effects are more excellent.

REFERENCE SIGNS LIST

10: Metal vapor deposited film
11: Transparent base material
12: Metal vapor deposited layer
12a: Island portion
13: Primer layer
20: Adhesive layer
30: Resin substrate
100: Metallic decorative member

The invention claimed is:

1. A metallic decorative member comprising a metal vapor deposited film having a metal vapor deposited layer on a transparent base material, the transparent base material being disposed so as to face toward the outer layer side, wherein the transparent base material is a transparent resin base material containing rubber particles and a binder resin; the metal vapor deposited layer has island portions composed of a metal and sea portions positioning between the island portions; and an area A per island portion is 4,400 to 56,000 nm², which is further satisfied with the following conditions:
  wherein a value of distinctness of image as measured from the outer layer side of the metallic decorative member by using a wave scanning apparatus is designated as "D1"; subsequently, the metallic decorative member in which D1 is measured is dried at 75° C. for 72 hours; after allowing to stand for cooling until the surface temperature on the outer layer side of the metallic decorative member reaches room temperature, a value of distinctness of image as measured from the outer layer side of the dried metallic decorative member by using a wave scanning apparatus is designated as "D2"; subsequently, the metallic decorative member in which D2 is measured is subjected to vacuum molding; after allowing to stand for cooling until the surface temperature on the outer layer side of the metallic decorative member reaches room temperature, a value of distinctness of image as measured from the outer layer side of the vacuum-molded metallic decorative member by using a wave scanning apparatus is designated as "D3"; and on such assumption, it exhibits a relation of [(D2/D1)<(D3/D1)];
  wherein change in distinctness D2/D1 is 1.000 or higher and 1.050 or lower,
  wherein change in distinctness D3/D1 is 1.040 or higher and 1.150 or lower, and
  wherein change in distinctness D3/D2 is 1.040 or higher and 1.150 or lower.

2. The metallic decorative member according to claim 1, wherein an outer shell of the rubber particle contains an acrylic resin, and the binder resin contains an acrylic resin.

3. The metallic decorative member according to claim 1, wherein a thermal shrinkage ratio on the occasion of heating the transparent base material at 75° C. for 30 minutes is 1.0% or less.

4. The metallic decorative member according to claim 1, wherein a primer layer is provided between the transparent base material and the metal vapor deposited layer.

5. The metallic decorative member according to claim 1, wherein the metal vapor deposited layer is an indium vapor deposited layer.

6. The metallic decorative member according to claim 1, wherein a resin substrate is provided on the inner layer side of the metal vapor deposited film.

7. The metallic decorative member according to claim 6, wherein the resin substrate contains an ABS resin as the binder resin.

8. A metallic decorative molded body formed of the metallic decorative member according to claim 1.

* * * * *